(12) United States Patent
Jain (10) Patent No.: US 7,065,722 B2
(45) Date of Patent: Jun. 20, 2006

(54) SYSTEM AND METHOD FOR BUILDING A BINARY DECISION DIAGRAM ASSOCIATED WITH A TARGET CIRCUIT

(75) Inventor: Jawahar Jain, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 263 days.

(21) Appl. No.: 10/637,249

(22) Filed: Aug. 8, 2003

(65) Prior Publication Data

US 2004/0103378 A1 May 27, 2004

Related U.S. Application Data

(60) Provisional application No. 60/426,207, filed on Nov. 13, 2002.

(51) Int. Cl.
*G06F 17/50* (2006.01)

(52) U.S. Cl. .................................. 716/3; 716/2; 716/4

(58) Field of Classification Search .............. 716/1–21; 703/1–21
See application file for complete search history.

(56) References Cited

U.S. PATENT DOCUMENTS

| | | | | |
|---|---|---|---|---|
| 5,754,454 A | * | 5/1998 | Pixley et al. ................ | 702/123 |
| 5,937,183 A | * | 8/1999 | Ashar et al. ................... | 703/14 |
| 6,086,626 A | | 7/2000 | Jain et al. ...................... | 716/5 |
| 6,212,669 B1 | * | 4/2001 | Jain ............................... | 716/7 |
| 6,292,916 B1 | | 9/2001 | Abramovici et al. ......... | 714/736 |
| 6,308,299 B1 | * | 10/2001 | Burch et al. .................... | 716/4 |
| 6,321,186 B1 | * | 11/2001 | Yuan et al. ..................... | 703/15 |
| 6,389,374 B1 | * | 5/2002 | Jain et al. ....................... | 703/2 |
| 6,473,884 B1 | * | 10/2002 | Ganai et al. .................... | 716/3 |
| 6,499,129 B1 | | 12/2002 | Srinivasan et al. ............. | 716/4 |
| 6,848,086 B1 | * | 1/2005 | Teig et al. ....................... | 716/3 |

OTHER PUBLICATIONS

G. Cabodi, P. Camurati, S. Quer, "Improved Reachability Analysis of Large Finite State Machines," IEEE ICCAD.

* cited by examiner

*Primary Examiner*—Leigh M. Garbowski
*Assistant Examiner*—Nghia M. Doan
(74) *Attorney, Agent, or Firm*—Baker Botts L.L.P.

(57) ABSTRACT

A method for constructing a binary decision diagram (BDD) is provided that includes constructing a first BDD data structure operable to reflect a function associated with a target circuit, the first BDD data structure may be constructed using a first script that includes a first set of parameters such that the first BDD data structure exceeds a major threshold value. The method also includes constructing a second BDD data structure using a second script that includes a second set of parameters which reflect a modification to the first set of parameters, the modification reflecting an attempt to minimize a size associated with a node level of the second BDD data structure and being based on a minor threshold value that was identified in association with building the first BDD data structure.

24 Claims, 1 Drawing Sheet

SYSTEM AND METHOD FOR BUILDING A BINARY DECISION DIAGRAM ASSOCIATED WITH A TARGET CIRCUIT

RELATED APPLICATIONS

This application claims priority under 35 U.S.C. §119 to provisional patent application Ser. No. 60/426,207 entitled: "Verifying a Circuit Using One or More Partitioned Ordered Binary Decision Diagrams (POBDDs)" filed Nov. 13, 2002.

TECHNICAL FIELD OF THE INVENTION

This invention relates in general to the field of integrated circuits and more particularly to a system and method for building a binary decision diagram associated with a target circuit.

BACKGROUND OF THE INVENTION

Integrated circuits have become increasingly prevalent in today's society. The number of digital systems that include integrated circuits continues to steadily increase and may be driven by a wide array of products and systems. Added functionalities may be provided to integrated circuits in order to execute additional tasks or to effectuate more sophisticated operations in their respective applications or environments. Additionally, system parameters of integrated circuits may dictate that their operations be performed in an optimal time interval, which allows for even more operations to be accommodated in a given clock cycle. These rigorous demands associated with production and design generally result in the need for more advanced and complex verification processes and procedures. Flaws or inaccuracies in an integrated circuit or a digital element may inhibit system functionality and/or cause significant operational problems in a corresponding architecture.

In integrated circuits and other digital applications, a reachability analysis poses a significant problem. A binary decision diagram may be built to imitate a given function associated with a target circuit. A digital analysis may include a conjunction phase and a quantification phase that cooperate in order to produce an image computation for a given circuit. Either of these phases may present significant obstacles during operations. For example, graphs may become excessively large or 'blow-up' during a given analysis. Such a blow-up is impractical for system designers because it may generate a host of time-intensive activities or tasks. Additionally, such a result may not be feasible to evaluate because it forces a designer to exhaustively investigate the blow-up to ensure correctness or accuracy associated with that portion of a target circuit. Accordingly, the ability to verify or validate a design for any integrated circuit or digital element presents a significant challenge to digital system designers and integrated circuit manufacturers.

SUMMARY OF THE INVENTION

From the foregoing, it may be appreciated by those skilled in the art that a need has arisen for an improved digital analysis that offers the ability to properly build a binary decision diagram that suitably reflects a given function associated with a target circuit. In accordance with one embodiment of the present invention, a system and method for building a binary decision diagram associated with a target circuit are provided that substantially eliminate or greatly reduce disadvantages and problems associated with conventional computation digital analysis techniques.

According to one embodiment of the present invention, there is provided a method for constructing a binary decision diagram (BDD) that includes constructing a first BDD data structure operable to reflect a function associated with a target circuit, the first BDD data structure may be constructed using a first script that includes a first set of parameters such that the first BDD data structure exceeds a major threshold value. The method also includes constructing a second BDD data structure using a second script that includes a second set of parameters which reflect a modification to the first set of parameters, the modification reflecting an attempt to minimize a size associated with a node level of the second BDD data structure and being based on a minor threshold value that was identified in association with building the first BDD data structure.

Certain embodiments of the present invention may provide a number of technical advantages. For example, according to one embodiment of the present invention, a digital analysis is provided that is significantly faster than other computation approaches. This may be a result of a BDD-building process that is capable of achieving optimal results. The present invention may provide a checkpointing procedure, whereby two thresholds are marked. The thresholds may be identified as minor and major thresholds and an appropriate BDD manger may store their respective BDDs in suitable files. If the major threshold is reached during construction of a given BDD and the BDD cannot be reduced further, then various BDD construction scripts may be employed that include different parameters. The BDD from the script whose size meets acceptable limits may be used. This allows BDD sizes to be controlled for any application, inclusive of synthesis, verification, equivalence checking, or simulation for example. BDD sizes can be reduced for the BDD corresponding to either the major or minor threshold. When attempting to target a minor threshold, there is little need to address large BDDs. The script that reduces the size of the BDD the most may be utilized in such scenarios.

Another technical advantage associated with one embodiment of the present invention relates to its efficacy. The architecture of the present invention allows checkpointing-based BDD reduction to be performed quickly and accurately, while consuming minimal resources and effort on the part of a designer or an end user. This is also a result of the marking of the thresholds, which allow for a restarting of the BDD process. The restarting operation allows a minor threshold to be used in a second trial of the BDD construction. Additionally, such a concept may be employed in virtually any integrated circuit environment that performs some function or that processes digital information.

Yet another technical advantage associated with one embodiment of the present invention relates to its scalability. The present approach may be used to establish parallel operations. After minor points are identified, multiple configurations can be constructed that alter some parameters within a script. The modified script may then be run on several machines in parallel in order to attempt to obtain optimal graphs for those given BDDs. Such an approach may significantly enhance the chances of success for running applications that do not experience a blow-up. The appropriate script may be used for each configuration in order to generate such optimal results. Certain embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which.

DETAILED DESCRIPTION OF EXAMPLE EMBODIMENTS

Figure 1:
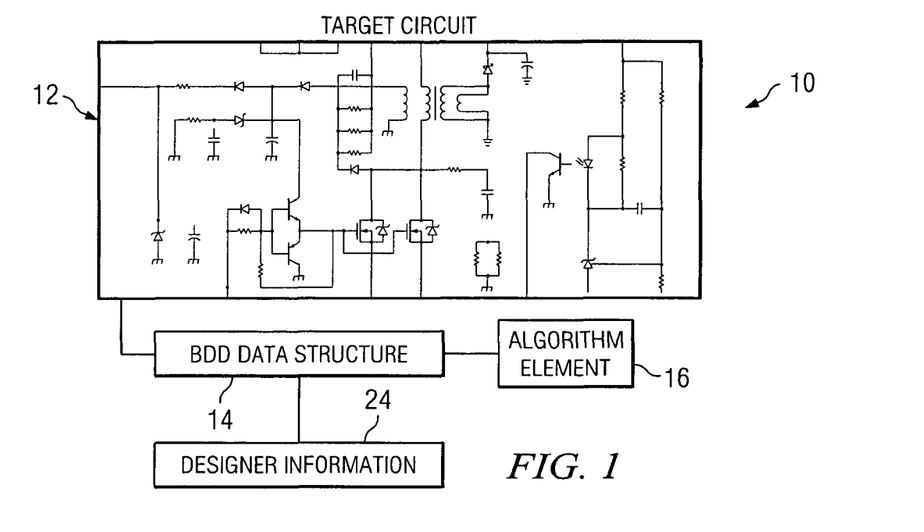
FIG. 1 is a simplified block diagram of a system for building a binary decision diagram in accordance with one embodiment of the present invention.

FIG. 1 is a simplified block diagram of a system 10 for building a binary decision diagram (BDD) associated with a target circuit 12. System 10 may include a BDD data structure 14 that may be coupled to an algorithm element 16, which may operate to build BDD data structure 14. Additionally, system 10 may include a segment of designer information 24 that may be used to communicate information that affects the construction of BDD data structure 14. Designer information 24 may reflect any particular information sought to be input or tested by an end user. System 10 may generally be positioned within, or otherwise operate in conjunction with, any integrated circuit, digital element, processing configuration, or binary architecture in which BDD procedures or processes may be implemented. Additionally, system 10 may be provided in cooperation with any device, component, hardware, software, object, or element associated with the digital processing of information or data.

According to the teachings of the present invention, system 10 operates to provide a BDD-building process capable of achieving optimal results. System 10 provides a checkpointing procedure, whereby two thresholds (associated with a number of nodes corresponding to a given graph) are marked. The thresholds may be identified as minor and major thresholds, where an appropriate BDD manger may store their respective BDDs in suitable files (or via any other suitable storage unit, object, or element). If the major threshold is reached during construction of a given BDD and the BDD cannot be reduced further, then multiple BDD construction scripts may be employed that include different BDD parameters. The BDD from the script whose size meets acceptable limits may be used. This allows BDD sizes to be controlled for any application, inclusive of synthesis, verification, equivalence checking, or simulation for example. BDD sizes can be reduced for the BDD corresponding to either major or minor thresholds. When attempting to target a minor threshold, there is little need to address larger BDDs. The script that reduces the BDD the most may still be utilized. System 10 allows checkpointing-based BDD reduction to be performed quickly and accurately, while consuming minimal resources and effort on the part of a designer or an end user.

For purposes of teaching, it is useful to offer a generalized discussion of some of the deficiencies that may be addressed by system 10. It is critical to note that this information is only being offered for purposes of example and should not be construed in any way to limit the scope or the application of system 10 to any suitable circuit environments. For formal verification, it is generally required that a reachability-based analysis be performed on a given design to determine which states can be reached from the initial state of a machine. Also, in synthesis or equivalence checking, the satisfiability of large and complicated formulas should be determined. However, BDDs (which generally reflect the chosen vehicle for computation for most applications) suffer from serious deficiencies.

A given computation generally involves conjunction and quantification segments. After quantification, typically the graphs associated with the analysis become smaller. In general, the graphs of data structures may be generated to represent a given function. When the data structure of a BDD becomes too large such that it holds too much information, it may be interpreted as excessively large. Such a scenario may be described or termed as a local blow-up.

Any analysis that produces a result that is over five million nodes (for example) may yield a BDD that is impractical or that requires more than an acceptable amount of time for each reordering call. It is thus important that graphs be prevented from reaching such large sizes. Most synthesis and verification tools use BDDs. However, BDDs are unpredictable in nature. For example, one method may generate small BDDs in a given computation and, yet, be totally impractical in the subsequent step. Typically, a BDD application is aborted when its size becomes too large and reordering cannot reduce the BDD to an acceptable size.

System 10 may be used to address such size issues and resolve the problem of a blow-up at either the conjunction or quantification stages. Because BDDs have such a widespread use in computer science, system 10 is applicable to any suitable environments associated with synthesis, verification, equivalence checking, or simulation for example. A BDD may be constructed for a particular formulation. Once an acceptable BDD has been constructed, the problem or issue being addressed by a given designer has been resolved. In a given application, an input problem may be a circuit or a formulation that may be derived for that given circuit. The formulation may be such that if it can be solved (build a BDD for that formulation), then the application may be viewed as having been successfully completed. Thus, constructing an appropriate BDD may represent a significant achievement in such a scenario.

For a given circuit having a function (e.g. 'f') that produces an output, a BDD may be built for that circuit, using an appropriate algorithm stored in algorithm element 16, such that 'f' is produced. Algorithm element 16 may produce a BDD that corresponds to a given output for target circuit 12. In this sense, algorithm element 16 may construct gates that correspond to elements within target circuit 12. One or more BDD managers may be included in a corresponding program and each BDD manager may be thought to own a portion of all of the BDDs in a given circuit. Each BDD manager may impose an order on all of the BDDs and system 10 provides the ability to destroy, create, or control/modify selected managers. Each BDD manager is thus responsible for all of the BDDs under that manager.

In operation, when a BDD exceeds a particular threshold, all selected BDDs, or a BDD for that particular point, gate, or operation, can be stored. Whenever BDDs are being constructed, it is somewhat of a sequential or chronological process. For example, points/gates A1 and A2 may be used to produce B1. Once B1 has been stored or identified, points A1 and A2 may be discarded or deleted. Similarly, B1 may be used with B2 in order to produce C1, whereby B1 and B2 become irrelevant. Thus, selected BDDs may be mapped and stored (e.g. in a file) that correspond to major and minor threshold points such that memory space may be optimized in not being consumed with points such as A1 or A2 after B1 has been identified. A given file may be inclusive of major and minor threshold points that guide an end user engaged in evaluating or studying a given target circuit 12.

System 10 allows an end user or a designer to re-run a given application using different parameters that provide for more beneficial results and that potentially avoid a blow-up. BDDs are generally unstable, as even small changes in parameters can cause corresponding graphs to become excessively large. Consequently, there are an infinite number of possibilities in altering or changing a given script or parameter in order to produce some result. A critical application may be being run, whereby a graph starts becoming large. When the graphs blow-up, a designer may take note of a particular point, identifying a particular size of a graph. A designer can then go back to previous BDDs (e.g. at a minor threshold) and use that information to continue with the analysis. For example, a major threshold could be represented as ten million nodes within a given BDD associated with target circuit 12, whereby the minor threshold could be provided as two million nodes. Accordingly, a designer can use the two million node graph in cases where the graph exceeds ten million (the major threshold in this example) and then attempt to use a different method or script to continue with the analysis. Thus, the path taken from two million forward in subsequent trials is different from the original path taken in the previous instance.

System 10 may be used in distinguishing between fundamental BDD algorithms and the parameters within scripts used to guide the algorithms. The algorithms may be used to construct the BDDs, whereby the function (f) represents an objective that is sought to be achieved. The parameters used may be generally included in a script and the algorithms may be included separately such that system 10 provides a succinct way of altering an analysis without affecting the entire processing environment. Thus, if a major threshold is met, the operation can return to a minor threshold and, from that minor threshold, the graph can be restarted with certain modifications to the parameter settings. For example, a designer may tune parameters associated with variable ordering, cluster size, decomposition points, variable splitting, number of windows generated, the types of windows used, the variables used, or the number of partitions implemented for example. A script can then be executed or run with modified parameters that attempt to provide a better path for the graph to follow.

In operation, system 10 provides a failover characteristic in cases where graphs (BDDs) become too large. A given function 'f' may be required to be generated. However, the BDD associated with 'f' may be too large. The inquiry addresses how to generate 'f' when previous trials have yielded graphs that are unacceptable. An arbitrary point 'g' (minor threshold) may be reached and a second point 'h' (major threshold) may also be reached during a blow-up. But the graph can be restarted using 'g' with a somewhat different approach. Thus, the threshold node level associated with the BDD may be noted and used as a starting point for a retrial of the graph. In this sense, system 10 provides a platform from which to evaluate the success of a given approach associated with a BDD graph. A careful check or an enhanced scrutiny or observation can be paid to BDDs, as they are constructed. By rerunning an operation in order to construct a proper BDD, the chances of success (in constructing a BDD having a given function) are improved by manipulating parameters within the script.

System 10 also provides the opportunity to establish parallel operations. After minor points are identified, multiple configurations can be constructed that alter some parameters within a script. The modified script may then be run on several machines in parallel in order to attempt to obtain optimal graphs for those given BDDs. Such a setup may significantly enhance the chances of success for running applications that do not experience a blow-up. The appropriate script may be used for each configuration in order to generate such optimal results.

Additionally, system 10 provides a platform that may accommodate a number of diverse architectures sought to be verified. System 10 provides a tool that can construct any type of BDDs to be used, for example, in a verification process. Moreover, system 10 may be useful in order to parallelize operations and significantly increase the speed of any reachability procedure. Such enhancements in BDD-building speed may also assist in creating faster verification tools and may assist in generating semi-formal verification tools in accordance with particular needs. Additionally, the quickness of the BDD-building architecture may be due, in part, to a checkpoint mechanism that allows BDDs to be mapped into a file and suitably stored when they become too large. Multiple scripts can be invited to be run on a particular BDD (e.g. multiple variable orders on a given BDD). If any particular script is able to reduce the size of the BDD, then the other scripts are discarded and the successful BDD may be carried forward. Such a method may be practical when the property to be verified is so critical that the failure of the verification method cannot be readily or easily tolerated. In such cases, a set of variable orders, clustering sizes, quantification schedules, variable splitting options, etc. may be tried in order to identify which choice is the most efficient. By implementing these scripts on the computation that was performed right before the failing computation, an optimal script can be identified even for smaller BDDs. Additionally, when a cluster of computers is available, multiple machines may be used. This may be particularly beneficial because BDDs are inherently difficult to parallelize. Thus, during each difficult computation, the design may be broken into multiple windows, whereby each window may be processed on a separate processor in a distributed, cluster-based computing environment.

Target circuit 12 is an electronic or a digital object that has a given function 'f' that is sought to be mimicked by BDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object or element capable of processing binary data or digital information in any circuit environment. Target circuit 12 may be designed specifically to include (or be capable of performing) some property. The term 'property' as used herein in this document is inclusive of any capability, characteristic, operation, action, or behavior that may be associated with target circuit 12. In operation, target circuit 12 may be emulated or imitated by BDD data structure 14 such that BDD data structure 14 performs some designated property or characteristic, or such that it executes a prescribed operation properly.

BDD data structure 14 is an element that is built by algorithm element 16 and that performs a given function 'f' associated with target circuit 12. BDD data structure 14 is a representation of a Boolean function for manipulation. As referred to herein, BDD data structure 14 may be inclusive of a partitioned (or partitioned reduced) order binary decision diagram (POBDD or PROBDD) or BDD data structures (potentially with partitioning) where appropriate. The terms PROBDD and POBDD are interchangeable and generally represented in various suitable fashions (for purposes of brevity in certain cases) in describing their applications. BDD data structure 14 may receive designer information 24 and be constructed in accordance with a given script that includes a set of selected parameters.

BDDs are generally canonical and, therefore, may be used for combinational equivalence checking. BDDs may be successively applied in reachable analyses for sequential circuit verification. Reachable state sets may be represented as BDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by BDD data structure 14.

In operation of an example embodiment, a designer or a manufacturer may write some algorithm or program that identifies a property, characteristic, operation, or behavior that is sought to be emulated by BDD data structure 14. The property or characteristic may be suitably written in a particular syntax before it is communicated to BDD data structure 14. The program may then be properly executed such that BDD data structure 14 is constructed and reflects the specified property or function of target circuit 12.

Algorithm element 16 is a data processing object that may include one or more algorithms that allow for a specific or a designated property to be mimicked by BDD data structure 14. Algorithm element 16 may include one or more scripts that may include one or more parameters that may be modified in order to generate a BDD having a smaller size. Algorithm element 16 may be included within BDD data structure 14 or provided external thereto in accordance with particular processing needs or arrangements. In addition, the scripts or parameters may be provided external to algorithm element 16 as separate components, modules, or elements where appropriate and in accordance with particular needs. Additionally, algorithm element 16 may communicate with any other external component that provides one or more instructions or characteristics to be used in verifying subspaces within target circuit 12. Moreover, algorithm element 16 may directly receive designer information 24 in order to verify one or more properties associated with target circuit 12. Designer information 24 may also include or specify the type of circuit or element being subjected to the BDD-building process. Algorithm element 16 may include any suitable hardware, software, objects, or elements operable to facilitate the verification operations being executed by BDD data structure 14.

For purposes of example and teaching it is useful to provide a further explanation of some of the algorithms that may be used in imitating selected properties associated with sub-spaces of target circuit 12. Many operations for the manipulation of Boolean functions can be performed efficiently for functions represented by OBDDs. For example, some of the basic operations are provided by:

1. Evaluation. For an OBDD G representing f and an input a compute the value f(a).

2. Reduction. For an OBDD G compute the equivalent reduced OBDD.

3. Equivalence test. Test whether two functions represented by OBDDs are equal.

4. Satisfiability problems. Problems may include:
   Satisfiability. For an OBDD G representing f find an input a for which f(a)=1 or output that no such input exists.
   SAT-Count. For an OBDD G representing f, compute the number of inputs a for which f(a)=1.

5. Synthesis (also referred to as apply). For functions f and g represented by an OBDD G include into G a representation for f$\otimes$g where $\otimes$ is a binary Boolean operation (e.g., $\wedge$).

6. Replacements (also called Substitution).
   Replacement by constants. For a function f represented by an OBDD, for a variable $x_i$ and a constant c $\in\{0, 1\}$ compute an OBDD for $f_{|x_i=c}$.
   Replacement by functions. For functions f and g represented by an OBDD and for a variable $x_i$ compute an OBDD for $f_{|x_i=g}$.

7. Universal quantification and existential quantification. For a function f represented by an OBDD and for a variable $x_i$ compute an OBDD for $(\forall x_i:f):=f_{|x_i=0}\wedge f_{|x_i=1}$ or $(\exists x_i:f):=f_{|x_i=0}\vee f_{|x_i=1}$, respectively.

In OBDD packages the operation reduction is usually integrated into the other operations such that only reduced OBDDs are represented. Many applications of OBDDs concern functions given as circuits. Hence, one important operation is the computation of an OBDD for a function given by a circuit, which is usually performed by the symbolic simulation of the circuit. This means that OBDDs for the functions representing the input variables are constructed. This may be easy because an OBDD for the function $x_i$ merely consists of a node labeled by $x_i$ with the 0-sink as 0-successor and the 1-sink as 1-successor. The circuit may be evaluated in some topological order (each gate is considered after all its predecessors have been considered) and a computation is made for each gate. The computation is a representation of the function at its output by combining the OBDDs representing the functions at its input using the synthesis operation.

Another possibility is that a given circuit is built of larger blocks. In such a case, OBDDs may be computed for the functions computed by each block and combine the OBDDs with the operation replacement by functions. In the case of computed OBDDs, for the functions represented by two circuits, the equivalence operation for OBDDs may be applied in order to test the circuits for equivalence.

In applications such as Boolean matching, signatures for the considered functions may be computed. A signature is a property of a function that can be computed efficiently and that is likely to be different for different functions. Signatures can be used to detect that given functions are different. A very simple signature is the number of satisfying inputs of a function. The operation SAT-count may be applied in order to compute this and other signatures where appropriate.

For purposes of teaching and example, some of the principles and concepts associated with POBDD, PROBDD, and BDD operations are provided below. The proffered description is only being provided to assist in the understanding of some of the complex theorems associated with BDD technology. The description should not be construed to limit any of the operations of any of the elements of system 10. It is imperative to recognize that the following description is for purposes of example only and should not be interpreted to restrict any other suitable operations that may be executed by BDD data structure 14 or any other element involved in the BDD-building process.

In order to describe partitioned ROBDDs, it is useful to consider the following example. Assume a Boolean function $f: B^n \to B$ defined over n inputs $X_n = \{x_1, \ldots, x_n\}$. The partitioned-ROBDD representation $X_f$ of f is defined as follows:

Given a Boolean function: $f: B^n \to B$ defined over $X_n$, a partitioned-ROBDD representation $X_f$ of f is a set of k function pairs, $x_f = \{(\omega_1, \bar{f}_1), \ldots, (\omega_k, \bar{f}_k)\}$ where, $\omega_i B^n \to B$ and $\bar{f}_i: B^n \to B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1 + w_2 + \ldots + w_k = 1$
3. $\bar{f}_i = w_i \wedge f$, for $1 \leq i \leq k$ In the example provided, + and $\wedge$ represent Boolean OR and AND respectively. The set $\{w_1, \ldots, W_k\}$ is denoted by W.

Each $w_i$ may be referred to as a window function. Intuitively, a window function $w_i$ may represent a part of the Boolean space over which f is defined. Every pair $(w_j, \bar{f}_i)$ may represent a partition of the function f. In, the example, the term "partition" is not being used in the sense where partitions have to be disjoint. If, in addition to conditions 1–3 (provided above), $w_i \wedge w_j = 0$ for $i \neq j$, then the partitions may be orthogonal. Each $(w_j, \bar{f}_i)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean netlist is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.

(2) Partition using "internal" variables, i.e., variables that are not input variables. Such variables can be pseudo-variables introduced at internal gates.

(3) Partition using a suitable combination of 1 and 2.

At any given point in time in the present filtering based verification process a decomposed representation may be reflected by, $f_d(\Psi, X)$, of F where $\Psi = \{\psi_1, \ldots, \psi_k\}$ is called a decomposition set and it corresponds to the internal cut set selected, typically, by the naive cut or the smart cut process, and each $\psi_i \in \Psi$. is a decomposition point. Let $\Psi_{bdd} = \{\psi_{1_{bdd}}, \ldots, \psi_{k_{bdd}}\}$ represent the array containing the ROBDDs of the decomposition points, i.e., each $\psi_i \in \Psi$. has a corresponding ROBDD, $\psi_{i_{bdd}} \in \Psi_{bdd}$, in terms of primary input variables as well as (possibly) other $\psi_j \in \Psi$., where $\psi_j \neq \psi_i$. Similarly, the array of $\psi_{i_{bdd}w_i}$ may be represented by $\psi_{i_{bdd}w_i}$. The composition [?] of $\psi_i$ in $f_d(\Psi, X)$ may be denoted by $f_d(\Psi, X) \cdot (\Psi_i \leftarrow \psi_{i_{bdd}})$, where, $$f_d(\Psi, X) \cdot (\psi_i \leftarrow \psi_{i_{bdd}}) = \overline{\psi_{i_{bdd}}} \cdot f_{d\overline{\psi_i}} + \psi_{i_{bdd}} \cdot f_{d\psi_i}'' \quad (1)$$

The vector composition of the $\Psi$ in $f_d(\Psi, X)$ may be denoted by $f_d(\psi, X) \cdot (\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\psi_{w_i}$ and $f_{d_w i}$ may be created. By composing $\psi_{bdd_w i}$, in $F_{dwi}$, the partition function $f_i = f_{w_i} f_i = f_{wi}$ may be achieved. Thus, given a set of window functions $w_i$, the partitioned-ROBDD $x_f$ of f may be given by $X_f = \{(w_i, w_i \wedge \int_{wi}) | 1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{wi}$ have disjoint support, $|\bar{f}_i| = w_i \wedge f_i | = (k + |f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i = f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|\bar{f}_i|$ can be $0(|w_i| |f_i|)$ in the worst case. To avoid this, while using general window functions, $w_i$s may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1 x_2, x_1 \overline{x_2}, \overline{x_1} x_2$ and $\overline{x_1 x_2}$. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables may be selected that maximize the partitioning achieved while minimizing the redundancy that may arise in creating different partitions independently. This reflects a fundamental principle of many divide and conquer approaches. The cost of partitioning a function f on variable x may be defined as:

$$\text{cost}_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_x}{f}\right) \quad (3)$$

and $r_x(f)$ represents the redundancy factor and is given by, $$r_x(f) = \left(\frac{|f_x + f_{\bar{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$\text{cost}_x(F) = \sum_{i=1}^{k} \text{cost}_x(f_i)$$

The PIs may be numbered in increasing order of their cost of partitioning $f_d$ and $\psi$ and the best 'k' (where 'k' is a predetermined number specified by the user) may also be selected. Using a similar cost function, PI variables may be selected as well as pseudo-variables, such as a $\psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$, is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\bar{x}}}$ and $\Psi_{\bar{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_d|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$s in $f_d$ is successively composed. If the graph size increases significantly for some composition (e.g. $\Psi_j$), a window function may be selected (e.g. w) based on the current $f_d$ and $\psi_{j_{bdd}}$. The window functions may be either a PI and its complement or some $\psi_{k_{bdd}}$ and its complement that is expressed in terms of PIs only and that has a small size.

Once the window function w is obtained, two partitions $(w \wedge f_{d_w}, \psi_w)$, and $(\bar{w} \wedge f_{d_w}, \psi_{\bar{w}})$ may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the $i^{th}$ partition given by $f_{d_w i}$ and $\psi_{w_i}$, the final step is to compose $\psi_{w_i}$ in $f_{d_w i}$, i.e., $f_{d_w i}(\psi, X)(\psi \leftarrow \psi_{bdd_w i})$ Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition. At each step, candidate $\psi_s$ may be restricted for composition to those decomposition points that are not present in any of the other $\psi_{bdd}$s. This may ensure that a decomposition variable needs to be composed only once in $f_d$.

An example operation is offered for purposes of illustrating some of the capabilities of system 10. It is important to note that this example should not be construed to limit the subject matter included therein, as this information is only being provided for purposes of teaching. Many computations (potentially involving OR or AND functions or both) are generally executed before a fixed point is reached. For example, between steps ten and eleven of a digital process a blow-up may occur. A partitioning may then be executed. The problem is that it may be known that partitioning is needed, but only after the BDD has blown up. Variables may be selected to reduce the blow-up, however because the blow-up has already occurred it is generally difficult to venture back to the last state that existed prior to blow-up. This may be due, in part, to the fact that computations are not readily reversible. The marking of major and minor thresholds may be used to alleviate this concern.

Note that micro-steps (e.g. steps one through nine in this example) are generally discarded in other applications, which may be expensive. System 10 may avoid such waste in identifying that the blow-up occurred at a particular stage. Each time a computation is executed, a record may be kept of abnormal behavior exhibited by clusters of BDDs when they are conjuncted together. Abnormal behavior may be reflected by a large graph, which may be significantly larger than expected. It the graph is too large, calculations may begin at a saved point (threshold) identified in the process.

For purposes of teaching, it is helpful to explain some of the operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition/relation operation. The transition/relation operation may link the transitions that are possible in a given state space, where there are certain rules that prohibit moving from state one to state ten because links are not present. The transitions that are possible and impossible may then be captured. Thus, the mirror (transition/relation operation) may indicate what transitions are possible in the system/circuit/state.

There are only some states that may be accessed after one application of a transition/relation operation. Accordingly, after applying the transition/relation operation, movement may be effectuated from that point to a greater depth. Similarly, from state one thousand, it may be determined the values of the original states using the transition/relation operation. Accordingly, a preimage may be achieved for a given set of states. The image is the reflection of the states as provided by the mirror (transition/relation operation). Imaging and/or preimaging techniques may be used in order to determine what is deep within target circuit 12.

In an example embodiment, 'deeper' generally refers to a depth parameter associated with target circuit 12, which is being analyzed. Certain states may be reachable and other states may be incapable of being reached without performing preliminary tasks first. States generally have different depths because some fixed-point calculations may terminate early and some others may extend far into a given test circuit. This may be based on the characteristics of a given function. The given function may be configured such that under some window or sub-spaces, the analysis may continue for an extended depth. Additionally, provenly deep states and a heuristical set of states may be present. The provenly deep states generally require a significant amount of work in order to determine if they are deep. A heuristical set of states generally provides no guarantee as to depth. Heuristical states may be provided (potentially quickly), however, it is unknown whether these states are deep. Thus, a balance is generally achieved between these two principles. Neither speed nor depth may be neglected in executing proper verification techniques. By using BDD data structure 14, some states may be calculated that are potentially deep or certain states may be projected as 'usually' deep and those states may be targeted for sampling.

Figure 2:
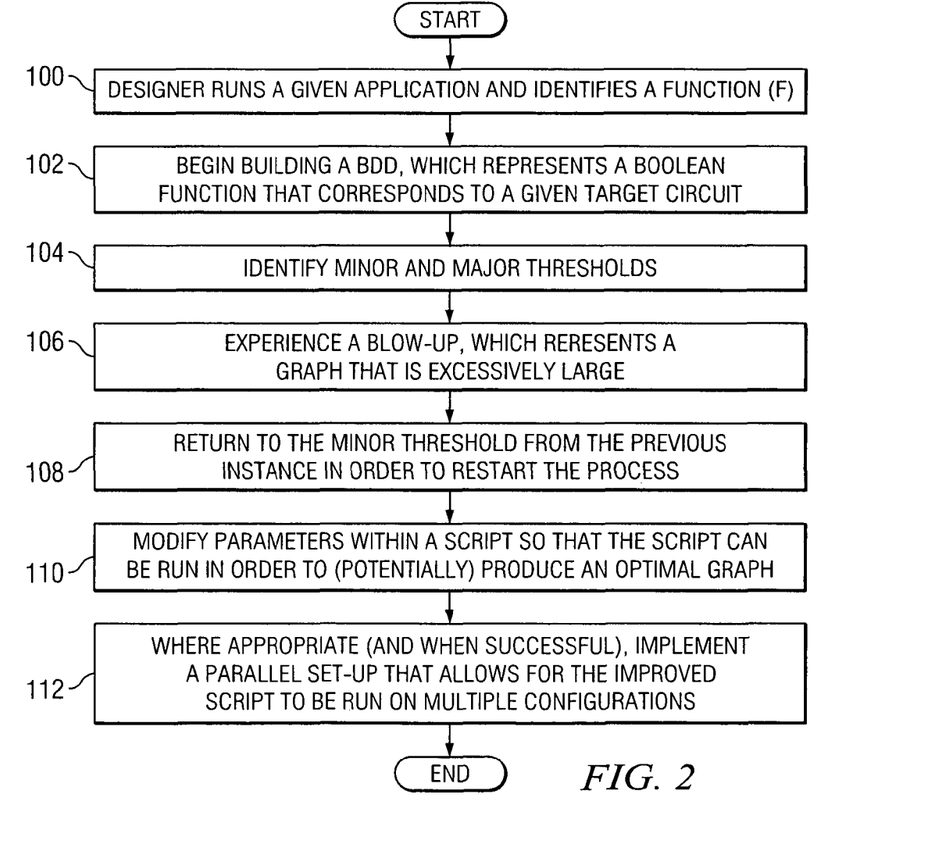
FIG. 2 is a flowchart illustrating a series of example steps associated with a method for building a binary decision diagram associated with a target circuit in accordance with one embodiment of the present invention.

FIG. 2 is a simplified flowchart illustrating a series of example steps associated with a method for constructing BDDs associated with target circuit 12. The method may begin at step 100, where a designer evaluates a particular circuit, such as target circuit 12, and attempts to run some application that requires a construction of a function (f). Thus, target circuit 12 may be evaluated, whereby a function is identified, as a result of a desire to run a particular application. An initial BDD may be constructed at step 102 that reflects a Boolean function corresponding to a given function of target circuit 12. Algorithm element 16 may be used to build (or assist in building) the selected BDD. While attempting to construct the BDD, the major and minor thresholds may be identified at step 104.

A blow-up may occur at step 106, the blow-up representing a graph that is excessively large. At step 108, the minor threshold from the previous instance may be revisited in order to restart the process. At step 110, parameters within a given script may be modified in order to produce another BDD that is not excessively large. The optimal script may be used to initiate a parallel configuration. This allows multiple machines to use an optimal script (or a preferred set of parameters) in parallel operations at step 112.

Note that once the blow-up and a minor threshold has been identified, if the attempts to improve the BDD-building process are unsuccessful, then an option exists to partition the graph at the minor threshold and then proceed from that point forward using only partial information about the function. Thus, m partitions of the Boolean space can be created and some k out of m partitions may be chosen (where k<m,) and a representation for the function may be built. This may likely yield a partial solution to the problem, but provide the benefit of returning some answer instead of nothing. Note also that at this stage, a given end user or designer may know that there is (virtually) no solution or possibility of completing the construction of the BDD of the given function. Thus, the partial construction becomes somewhat more beneficial than it might otherwise be.

Some of the steps illustrated in FIG. 2 may be changed or deleted where appropriate and additional steps may also be added to the flowchart. These changes may be based on specific BDD-building architectures or particular arrangements and configurations and do not depart from the scope or the teachings of the present invention.

Although the present invention has been described in detail with reference to particular embodiments, system 10 may be extended to any scenario in which BDD-building is sought for a given target circuit, device, component, or element that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as BDD data structure 14, and algorithm element 16, these elements may be provided in a single integral unit where appropriate or replaced with devices that effectuate their functions. BDD data structure 14 may be used with any other suitable checking, simulation, synthesis, or design protocol in order to enhance the BDD-building capabilities thereof. Additionally, designer information 24 may be communicated or otherwise offered to BDD data structure 14 in any appropriate manner.

In addition, although system 10 has been described with reference to one or more discreet components, additional intermediate components may be provided to system 10 in order to facilitate the processing operations thereof. For example, additional components may be used in the communication of information between any suitable element and BDD data structure 14. The present invention enjoys considerable versatility in that these components may be capable of operating in conjunction with various intermediate processing elements, in any suitable fashion, that facilitate the BDD-building procedure for a given target element or object.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is:

1. An apparatus, comprising:
    a first binary decision diagram (BDD) data structure operable to reflect a function associated with a target circuit, wherein the first BDD data structure is constructed using a first script that includes a first set of parameters such that the first BDD data structure exceeds a major threshold value; and
    a second BDD data structure operable to reflect the function associated with the target circuit and that is constructed using a second script that includes a second set of parameters which reflect a modification in the first set of parameters, the modification reflecting an attempt to reduce a size associated with a node level of the second BDD data structure such that it is smaller than the first BDD data structure and being based on a minor threshold value that was identified in association with building the first BDD data structure.

2. The apparatus of claim 1 further comprising:
    an algorithm element that includes one or more algorithms, the algorithm element being operable to generate the first and second BDD data structures.

3. The apparatus of claim 1, wherein the parameters included within the first and second scripts are selected from a group of elements consisting of:
    a) variable order;
    b) cluster size;
    c) decomposition points;
    d) splitting variables;
    e) a number of partitions;
    f) a number of windows generated;
    g) types of windows used; and
    h) variables used.

4. The apparatus of claim 1, further comprising:
    first and second BDD managers operable to control building of the first and second BDD data structures respectively, wherein the first and second BDD managers are operable to modify the first and second scripts in order to control a size associated with the first and second graphs of the first and second BDD data structures respectively.

5. The apparatus of claim 1, wherein the first BDD data structure is monitored such that when a blow-up occurs, the major and minor threshold values associated with the first BDD data structure may be mapped to a file and stored, the file being used as a basis for modifications to the first script.

6. The apparatus of claim 1, further comprising:
    a plurality of processors operable to use the second script in order to build a plurality of additional BDD data structures in parallel having the function associated with the target circuit.

7. A method for constructing a binary decision diagram (BDD), comprising:
    constructing a first BDD data structure operable to reflect a function associated with a target circuit, wherein the first BDD data structure is constructed using a first script that includes a first set of parameters such that the first BDD data structure exceeds a major threshold value; and
    constructing a second BDD data structure using a second script that includes a second set of parameters which reflect a modification to the first set of parameters, the modification reflecting an attempt to minimize a size associated with a node level of the second BDD data structure and being based on a minor threshold value that was identified in association with building the first BDD data structure.

8. The method of claim 7, further comprising:
    executing one or more algorithms in order to generate the first and second BDD data structures.

9. The method of claim 7, wherein the parameters included within the first and second scripts are selected from a group of elements consisting of:
    a) variable order;
    b) cluster size;
    c) decomposition points;
    d) splitting variables;
    e) a number of partitions;
    f) a number of windows generated;
    g) types of windows used; and
    h) variables used.

10. The method of claim 9, further comprising:
    controlling building of the first and second BDD data structures by modifying the first and second scripts respectively in order to control a size associated with first and second graphs of the first and second BDD data structures.

11. The method of claim 9, further comprising:
    monitoring the first BDD data structure such that when a blow-up occurs, the major and minor threshold values associated with the first BDD data structure may be mapped to a file and stored, the file being used as a basis for modifications to the first script.

12. The method of claim 9, further comprising:
    implementing a plurality of processors in order to use the minor threshold value to build a plurality of additional BDD data structures in parallel that have the function of the target circuit.

13. A system for constructing a binary decision diagram (BDD), comprising:
    means for constructing a first BDD data structure operable to reflect a function associated with a target circuit, wherein the first BDD data structure is constructed using a first script that includes a first set of parameters such that the first BDD data structure exceeds a major threshold value; and
    means for constructing a second BDD data structure using a second script that includes a second set of parameters which reflect a modification to the first set of parameters, the modification reflecting an attempt to minimize a size associated with a node level of the second BDD data structure and being based on a minor threshold value that was identified in association with building the first BDD data structure.

14. The system of claim 13, further comprising:
means for executing one or more algorithms in order to generate the first and second BDD data structures.

15. The system of claim 13, wherein the parameters included within the first and second scripts are selected from a group of elements consisting of:
a) variable order;
b) cluster size;
c) decomposition points;
d) splitting variables;
e) a number of partitions;
f) a number of windows generated;
g) types of windows used; and
h) variables used.

16. The system of claim 13, further comprising:
means for controlling building of the first and second BDD data structures by modifying the first and second scripts respectively in order to control a size associated with first and second graphs of the first and second BDD data structures.

17. The system of claim 13, further comprising:
means for monitoring the first BDD data structure such that when a blow-up occurs, the major and minor threshold values associated with the first BDD data structure may be mapped to a file and stored, the file being used as a basis for modifications to the first script.

18. The system of claim 13, further comprising:
means for processing a plurality of additional BDD data structures in parallel that have the function of the target circuit.

19. Software for constructing a binary decision diagram (BDD), the software being embodied in a computer readable medium and comprising code such that when executed is operable to:
construct a first BDD data structure operable to reflect a function associated with a target circuit, wherein the first BDD data structure is constructed using a first script that includes a first set of parameters such that the first BDD data structure exceeds a major threshold value; and
construct a second BDD data structure using a second script that includes a second set of parameters which reflect a modification to the first set of parameters, the modification reflecting an attempt to minimize a size associated with a node level of the second BDD data structure and being based on a minor threshold value that was identified in association with building the first BDD data structure.

20. The computer readable medium of claim 19, wherein the code is further operable to:
execute one or more algorithms in order to generate the first and second BDD data structures.

21. The computer readable medium of claim 19, wherein the parameters included within the first and second scripts are selected from a group of elements consisting of:
a) variable order;
b) cluster size;
c) decomposition points;
d) splitting variables;
e) a number of partitions;
f) a number of windows generated;
g) types of windows used; and
h) variables used.

22. The computer readable medium of claim 19, wherein the code is further operable to:
control building of the first and second BDD data structures by modifying the first and second scripts respectively in order to control a size associated with first and second graphs of the first and second BDD data structures.

23. The computer readable medium of claim 19, wherein the code is further operable to:
monitor the first BDD data structure such that when a blow-up occurs, the major and minor threshold values associated with the first BDD data structure are mapped to a file and stored, the file being used as a basis for modifications to the first script.

24. The computer readable medium of claim 19, wherein the code is further operable to:
build a plurality of additional BDD data structures in parallel that have the function of the target circuit.

* * * * *